United States Patent
Nakao et al.

(10) Patent No.: US 6,513,233 B1
(45) Date of Patent: Feb. 4, 2003

(54) COMPONENT MOUNTING METHOD AND APPARATUS

(75) Inventors: Osamu Nakao, Osaka (JP); Noriaki Yoshida, Ikeda (JP); Takeshi Takeda, Yamanashi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/807,966

(22) PCT Filed: Oct. 25, 1999

(86) PCT No.: PCT/JP99/05893

§ 371 (c)(1),
(2), (4) Date: May 31, 2001

(87) PCT Pub. No.: WO00/25564

PCT Pub. Date: May 4, 2000

(30) Foreign Application Priority Data

Oct. 27, 1998 (JP) .......................................... 10-304884

(51) Int. Cl.[7] .................................................. B23P 19/00
(52) U.S. Cl. ............................... 29/740; 29/739; 29/743
(58) Field of Search .......................... 29/740, 739, 743, 29/832, 834, 842

(56) References Cited

U.S. PATENT DOCUMENTS

| | | | |
|---|---|---|---|
| 4,944,086 A | * 7/1990 | Nishihara et al. | 79/837 |
| 5,285,946 A | 2/1994 | Tomigashi et al. | 228/9 |
| 5,850,112 A | * 12/1998 | Sienz et al. | 310/12 |
| 6,409,159 B1 | * 6/2002 | Asai et al. | 248/636 |

* cited by examiner

*Primary Examiner*—Charles G. Freay
*Assistant Examiner*—Emmanuel Sayoc
(74) *Attorney, Agent, or Firm*—Greenblum & Bernstein, P.L.C.

(57) ABSTRACT

The component handling tool (14) is moved linearly up and down on a moving mechanism (11) by feedback control of a linear motor (16) for performing pickup and mounting actions of components (3). The linear motor is controlled to effect a downward movement of the component handling tool for bringing the component handling tool or the component held thereby closer to the component or to a mounting object, and upon detecting changes in control information when contact is made with the component or the mounting object, control of the linear motor is switched to a pressing operation, whereby the holding or mounting of the component in a prescribed pressed condition is accomplished.

11 Claims, 9 Drawing Sheets

COMPONENT MOUNTING METHOD AND APPARATUS

TECHNICAL FIELD

The present invention relates to a component mounting method and apparatus for mounting components on mounting objects, such as are used in mounting electronic components on circuit boards, in either provisional mountings or actual mountings, to manufacture electronic circuit boards.

BACKGROUND ART

Figure 9:
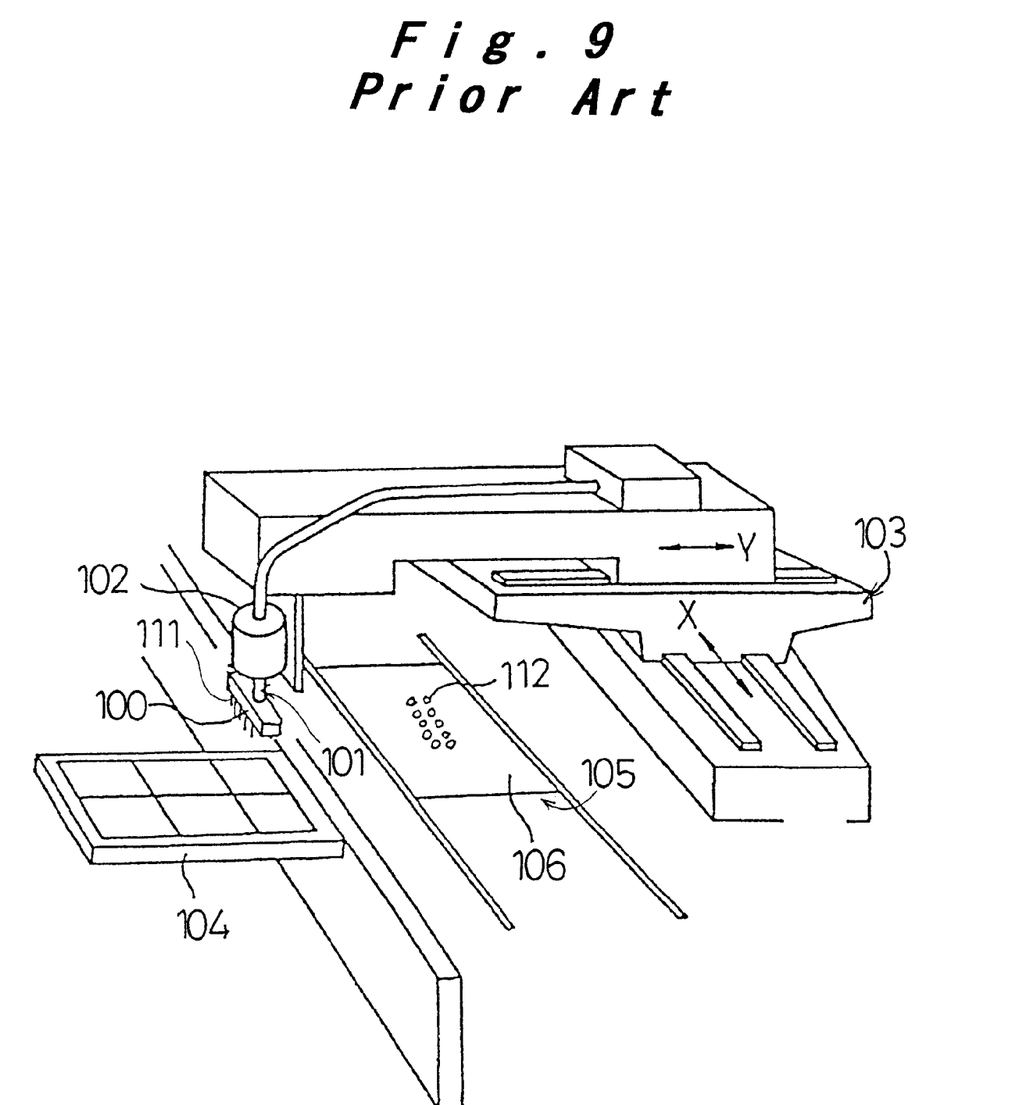
FIG. 9 is a simplified configuration diagram for a conventional component mounting apparatus.

A conventional component mounting apparatus for manufacturing electronic circuit boards is shown in FIG. 9. A component mounting head 102 equipped with a suction nozzle movable up and down 101 for handling an electronic component is supported on an X-Y robot 103, which is moved in two perpendicular directions, X and Y, for moving the component mounting head 102 to a component supply unit 104 and a component mounting unit 105. An electronic component 100 supplied by a component supply unit 104 is picked up and carried by the suction nozzle 101, and mounted at a prescribed position on a circuit board 106 located in the component mounting unit 105.

Figure 10:
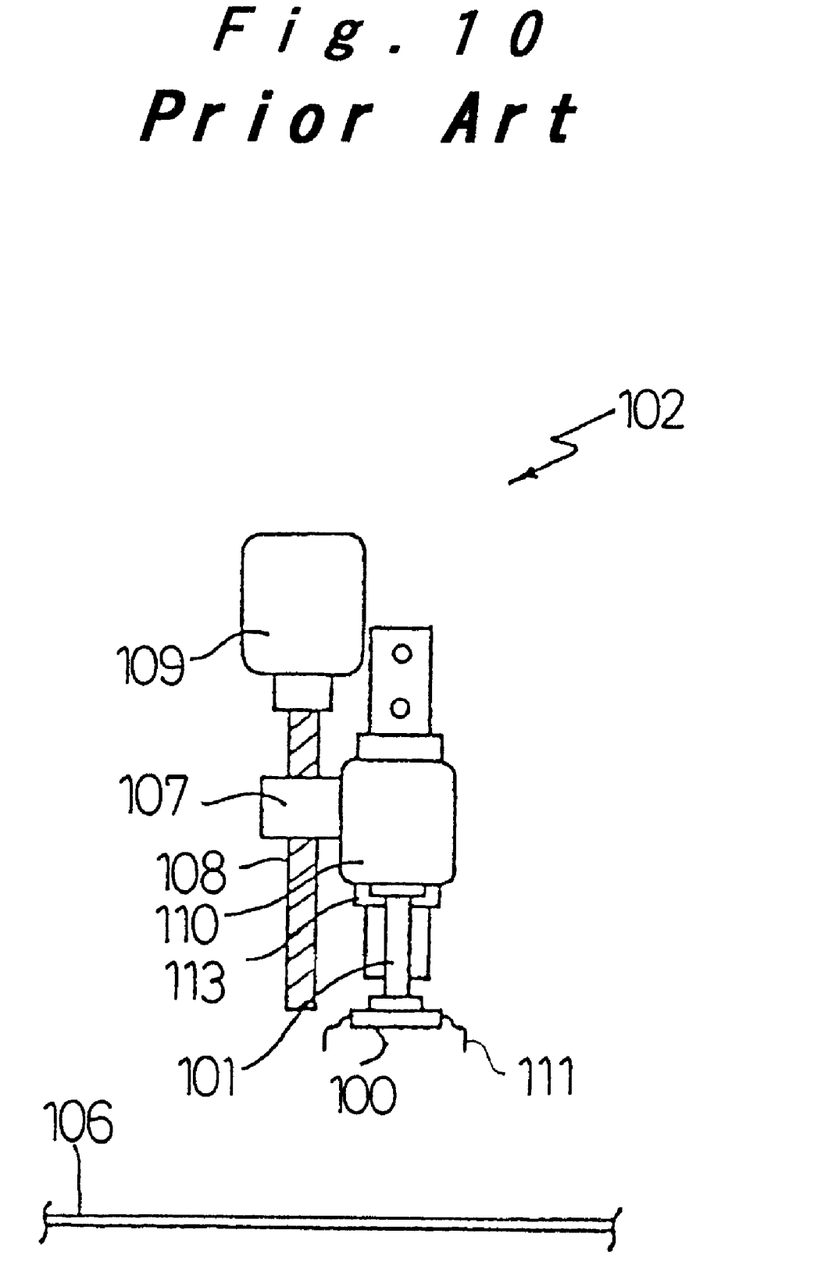
FIG. 10 is a front view of the component mounting head in the apparatus of FIG. 9.

The suction nozzle 101 is installed on the component mounting head 102 such as to be movable up and down in order to pick up and mount the electronic component 100. Referring to FIG. 10, a nut 107 provided integrally with a support member 113 for the suction nozzle 101 screws onto a ball screw 108 that is turned in both opposite directions by a motor 109 to cause the suction nozzle 101 to move up and down. When the orientation of the electronic component 100 held by the suction nozzle 101 is improper, the suction holding attitude is corrected by turning the suction nozzle 101 about its axis line by a motor 110.

Some electronic components involve insertion of their parts into the circuit board in order to accomplish the mounting to the circuit board 106. Such electronic components 100 are of various types, including axial components, radial components, odd-shaped components having leads or pins, DIP (dual inline package) type IC chips, and connectors provided with leads.

Of these, electronic components which can be handled by a suction nozzle such as described above include DIP IC chips which have a flat upper surface and connectors. For other electronic components, mounting devices are used which have component handling tools especially adapted to those components, respectively.

In any case, the electronic component 100 is held, picked up, and handled by a suction nozzle 101 or other component handling tool. When insertion is involved in mounting the component to a circuit board 106, it is necessary, simultaneously-with positioning the electronic component 100 at the prescribed position on the circuit board 106, to bring the electronic component 100 straight up to the circuit board 106 in a condition wherein multiple pins or leads or other insertion parts in the side of the electronic component 100 all correctly correspond to insertion holes 112 in the side of the circuit board 106, and to apply pressure in a condition where these are in mutual contact, thereby inserting the leads 111 into the insertion holes 112.

Such positional relationships are not always set up properly, however, and failures sometimes arise due to faulty positioning. In order for the insertion described above to be performed in the right amount without fail, it is necessary to cause the electronic component 100 to make contact with the circuit board 106, and to push it in, in the prescribed condition. However, with a drive effected by the ball screw 108 described earlier, there is very little resistance when the electronic component 100 is pressed, whereupon the pressing force cannot be finely controlled, and pressing tends to become excessive. It is also difficult to discern from the resistance, etc., in the insertion operation, whether the leads 111 are inserted or not inserted in the insertion holes 112. In addition, there is also play in the part that screws into the nut 107 that converts circular motion to linear motion, and there are effects produced by backlashes, whereupon appropriate measures cannot be taken that correspond to whether the insertion condition is proper or faulty.

Because of these problems, excessive pressing is easily administered, especially when the leads 111 or other insertion parts are not correctly inserted in the insertion holes 112 in the circuit board 106, whereupon either the electronic component 100 or the circuit board 106 or both are damaged by breaks or cracks, which damage causes a decline in the production yield of the electronic components and the circuit boards.

In other cases where it is necessary to press the suction nozzle 101 against the electronic component 100, or where it is necessary to apply pressure to mount the electronic component 100 to the circuit board 106, similar problems arise because the pressing force cannot be adequately controlled.

An object of the present invention is to provide a component mounting method and apparatus, with which a component can be mounted without excessive pressing.

DISCLOSURE OF THE INVENTION

In order to accomplish the above object, the present invention provides a component mounting method wherein a component supplied by a component supply unit is picked up, carried, and mounted on a mounting object located at a component mounting position, using a component handling tool that is supported by a moving mechanism and is moved to the component supply unit and a component mounting unit, characterized in that: the component handling tool is linearly moved up and down for performing component pick-up and mounting actions by feed-back control of a linear motor, wherein, when the component handling tool needs to be moved down for picking up a component or for mounting a component held on the component handling tool on the mounting object, the linear motor is controlled to effect a downward movement of the component handling tool, and when contact is made between the component handling tool and the component or between the component and the mounting object, upon which changes in control information of the feedback control of the linear motor are detected, control of the linear motor is switched to a pressing operation, whereby the component is picked up or mounted in a predetermined pressed condition.

Thus the component handling tool is moved to the component supply unit or component mounting unit by the moving mechanism, whereupon, whether performing component pickup at the component supply unit or component mounting in the component mounting unit, such can be accomplished with an up and down movement by the linear action of a linear motor on the moving mechanism. With the feedback control of this linear motor, the component handling tool prior to holding the component and/or the component held by the component handling tool is brought close to the component and/or the mounting object, in order to pick up or mount the component, by controlling the linear motor to effect a downward movement of the component handling tool, and contact therewith is first effected. When contact is made, there is a change in the control information due to the targeted position having been arrived at. The point in time where contact was actually made can be detected by the change in the control information at this time.

Thereupon, at the point in time where that control information changed, the linear motor is switched from a downward moving operation to a pressing operation, and the holding or mounting of the component in the prescribed pressed condition is completed. When that is done, it is possible to definitely effect the holding and/or mounting of the component, under prescribed pressing, while preventing contact faults or floating, and without damaging or breaking, either the component or the mounting object by subjecting either to an excessive load. Also, in cases where the component mounting involves insertion in the side of the mounting object, such can be definitely accomplished by the prescribed pressing operation described in the foregoing. Accordingly, production yield is improved for the components and the mounting objects.

The above method can be implemented by using a component mounting apparatus comprising: a component supply unit for supplying components, a component mounting unit for mounting components on a mounting object, and a component mounting mechanism for moving a component handling tool to said component supply unit and said component mounting unit, so that the component handling tool picks up and carries components supplied by said component supply unit and mounts said components on the mounting object in the component mounting unit, wherein: said component mounting mechanism comprises: a moving mechanism for moving said component handling tool to said component supply unit and said component mounting unit; a linear motor for causing said component handling tool on said moving mechanism to move linearly up and down at said component supply unit and said component mounting unit and to cause said component to be picked up and mounted; and a controller for feedback-controlling said linear motor, such that, when the component handling tool needs to be moved down for picking up a component or for mounting a component held on the component handling tool on the mounting object, the linear motor is controlled to effect a downward movement of the component handling tool, and when contact is made between the component handling tool and the component or between the component and the mounting object, upon which changes in control information of the feedback control of the linear motor are detected, control of the linear motor is switched to a pressing operation, whereby the component is picked up or mounted in a predetermined pressed condition.

The method described above can be thereby achieved stably and automatically according to a prescribed program.

The component mounting method according to another aspect of the present invention is characterized in that the component handling tool is linearly moved up and down for performing component mounting actions by feed-back control of a linear motor, wherein the linear motor is controlled to effect a downward movement of the component handling tool for bringing the component held by the component handling tool closer to the mounting object until after an insertion part of the component has been inserted in a corresponding hole in the mounting object, and when contact is made between the component and the mounting object in a predetermined condition, upon which changes in control information of the feedback control of the linear motor are detected, control of the linear motor is switched to a pressing operation, whereby the component is mounted in a predetermined pressed condition.

Thus the point in time where the body of the component, in the prescribed insertion condition, actually contacts the mounting object can be ascertained, the downward moving operation can be switched to a pressing operation at that point in time, and so the component can be definitely mounted in the prescribed pressed condition, while insertion faults are prevented.

Such a method is well suited to components having leads, such as connectors. The controller controls the linear motor such that the component handling tool is lowered for bringing the component held by the component handling tool close to the mounting object until the insertion parts of the component make contact with the mounting object, and is further lowered, until after the insertion parts have been inserted in the mounting object. Upon detecting changes in the control information when the body of the component contacts the mounting object in a predetermined insertion condition, control of the linear motor is switched to a pressing operation.

In the mounting of a component held by a component handling tool that involves insertion in a mounting object as in the case described above, it is possible, from the control information and the position of the linear motor corresponding thereto, to determine whether the insertion is proper or faulty, based on positional discrepancies between the insertion parts of the component and the insertion holes in the mounting object, in terms of height abnormalities. Such determinations can be accomplished automatically by determination means which receive the information. Based on this determination, when the component insertion is faulty, the mounting operation for that same component can be repeated, whereupon it is possible to avoid damaging the components or mounting objects by forcing an insertion operation without correcting an insertion fault, or to avoid discarding the component as a faulty component.

Other objects and characteristics of the present invention will become evident in the detailed descriptions and drawings given below. The characteristic features of the present invention can be used, where possible, alone, or in various multiple combinations.

BEST MODE FOR CARRYING OUT THE INVENTION

Preferred embodiments of the component mounting method and apparatus of the present invention are now described with reference to the drawings.

Figure 6:
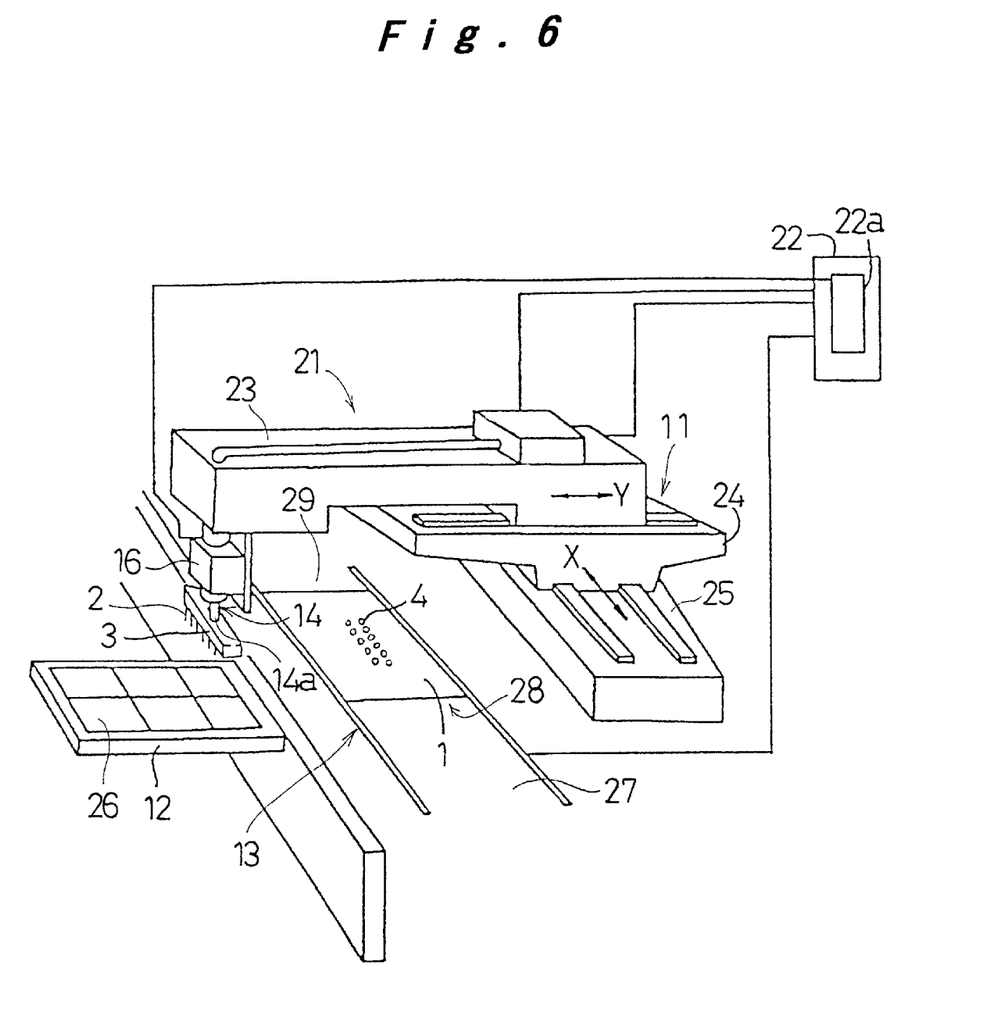
FIG. 6 is a simplified configuration diagram for the component mounting apparatus shown through FIGS. 1 to 5.
Figure 7:
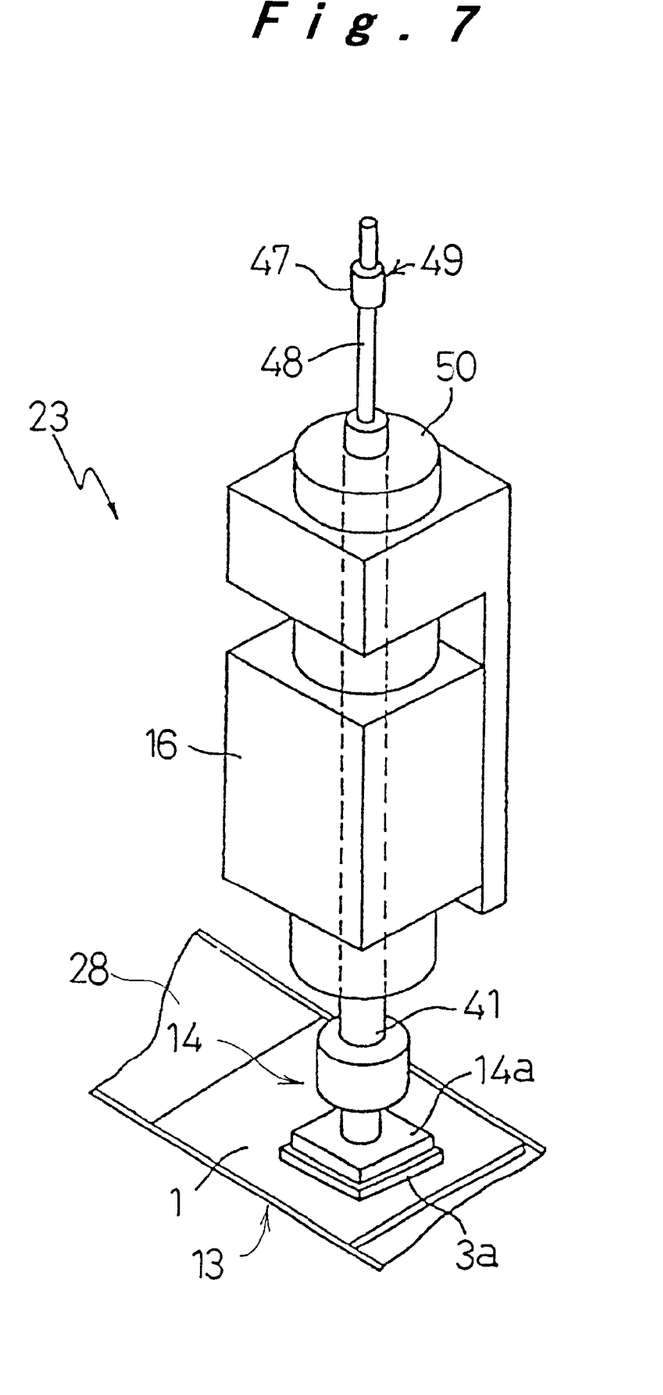
FIG. 7 is a perspective view of the main parts of the component mounting head in the apparatus shown in FIG. 6.

This embodiment is one example of a case where a connector 3 having numerous leads 2 as shown in FIG. 6, or a DIP type IC 3a, as shown in FIG. 7, is handled as one component to be mounted on a circuit board 1, and mounting of the component to the circuit board 1 is performed, either involving insertion of the leads 2 into insertion holes 4 in the circuit board 1, or not involving insertion. However, the present invention is not limited to or by this, and can be applied to cases in general wherein mounting is performed, whether of various components involving insertion or various components not involving insertion, and whether as single components or in various multiple combinations of different types of components.

The component mounting method in this embodiment is described with reference to the apparatuses shown through FIGS. 1 to 8. As shown in FIG. 6, a component handling tool 14 is used which is supported by a moving mechanism 11 such as to be moved to and positioned at a component supply unit 12 and component mounting unit 13. The moving mechanism 11 can be any mechanism whatever, irrespective of its movement path, so long as it can move the component handling tool 14 in this manner. With such component handling tool 14, a connector 3 or DIP type IC 3a or other component supplied by the component supply unit 12 is held, picked up, and carried, and the component 3 is mounted on a mounting object such as the circuit board 1 positioned by the component mounting unit 13. In this embodiment, a suction nozzle 14a is used for the component handling tool 14 for the holding of the flat shape of the upper surface of the connector 3 or DIP type IC 3a. This does not pose a limitation, however, and a chuck that grips the component from either side, or coupling device that holds the component by a screw connection or the like may be employed depending on the shape or form of the components being handled. Thus it is possible to adopt hardware which holds and handles components in various ways. It is also possible to employ several different types of handling tools that are changed or selectively used according to the types of components.

The suction nozzle 14a performs pickup and mounting actions of the connector 3 in linear actions by the feedback control of a linear motor 16 on the moving mechanism 11. The linear motor 16 is controlled to move the suction nozzle 14a downward before or after the component holding for bringing the suction nozzle 14a closer to the connector 3 or to the circuit board 1. Then, with changes in the control information when contact is made therewith, the linear motor 16 is switched from the downward moving operation to a pressing operation. The holding of the connector 3 in a prescribed pressed condition by the suction nozzle 14a, or the mounting of the connector 3 held by the suction nozzle 14a to the circuit board 1, is thus accomplished.

The picking up of the component such as the connector 3 at the component supply unit 12 or the mounting of the connector 3 on the circuit board 1 in the component mounting unit 13 is accomplished by the linear upward and downward movements of the suction nozzle that are effected by the linear motor 16 on the moving mechanism 11. During the feedback control of the linear motor 16, when the linear motor 16 is controlled to cause a downward movement of the suction nozzle, and the suction nozzle 14a or the connector 3 held by the suction nozzle 14a is moved close to the connector 3 or to the circuit board 1, there is a change in the control information brought about by the arrival at the targeted position when the suction nozzle or the connector is brought into contact with the component or the circuit board. The point in time where actual contact is made can be detected by the change at this time in the control information.

Thereupon, at the point in time where this control information changes, the linear motor 16 is switched from the downward moving operation to a pressing operation, and the holding or mounting of the connector 3 in a prescribed pressed condition is completed, wherefore a pressed condition can be attained that is neither excessive nor inadequate with a pressing start based on the actual contact position. Accordingly, the holding or pickup of the connector 3, and the mounting thereof can be achieved without fail under prescribed pressing, while preventing contact faults or floating without damaging or breaking the connector 3, the circuit board 1, or the suction nozzle 14a by subjecting them to excessive loads. Not only in cases where no insertion in the circuit board 1 is involved, but also in cases where mounting is done that does involve insertion of the connector 3 or the like in the side of the circuit board 1, such can be achieved definitely and without taking excessive measures, using a downward moving operation to effect contact at the prescribed position, and a prescribed pressing operation from the contact condition at that prescribed position. The production yield for the connectors 3 or other components and the circuit boards 1 is thus improved, and the useful life of the suction nozzle 14a and other component handling tools 14 can be lengthened.

It is preferable that both control be made of the linear motor 16 when the suction nozzle 14 is brought into contact with the connector 3 supplied by the component supply unit 12 and thereby held, and of the linear motor 16 when the connector 3 or other component held by the suction nozzle 14a is mounted to the circuit board 1, either involving insertion or not involving insertion. Nevertheless, it will be effective to make only one or other of such control.

Referring now to FIG. 6, the component mounting apparatus of this embodiment, in order to implement the method described above, comprises a component supply unit 12 for supplying components 3 such as the connectors, a component mounting unit 13 for mounting the connector 3 to the circuit board 1, and a component mounting mechanism 21 for moving the suction nozzle 14a that serves as the component handling tool 14 for holding and handling the connector 3 to the component supply unit 12 and component mounting unit 13, holding and picking up the connector 3 supplied by the component supply unit 12 with the suction nozzle 14a and carrying this, and mounting the connector 3 thus carried in to the circuit board 1 with the component mounting unit 13.

The component mounting mechanism 21 comprises a moving mechanism 11 for moving the suction nozzle 14a to the component supply unit 12 and the component mounting unit 13, a linear motor 16 for moving, on the moving mechanism 11, the suction nozzle 14a vertically in a linear movement at the component supply unit 12 and the component mounting unit 13, and performing pickup and mounting of the connector 3 or other component, and a controller 22. The controller 22 feedback-controls the linear motor 16 in a downward moving operation to move the suction nozzle 14a prior to component holding or the connector 3 held by the suction nozzle 14a close to the connector 3 or close to the circuit board 1, effecting contact therewith, switches the linear motor 16 from the downward moving operation to a pressing operation at the point in time where the control information changes when contact is made, and completes the holding or mounting of the connector 3 in a prescribed pressed condition. Thus the component mounting method as described in the foregoing can be implemented stably and automatically according to a prescribed program.

In the moving mechanism 11, as shown in FIG. 6, a component mounting head 23 equipped with the suction nozzle 14a is supported so that it can move in two directions, X and Y, by a Y table 24 and an X table 25, whereby the suction nozzle 14a can hold and pick up the connector 3 or any of various other components supplied by the component supply unit 12, carry this to the component mounting unit 13, and mount it in a circuit board 1 positioned therein. The component supply unit 12 has components such as the connector 3 or DIP type IC 3a accommodated in a tray 26, for example, arranged therein by component type, in a multi-stage stacked configuration. Thus components of the type needed can be pulled out when needed, and positioned in the component supply unit 12, so that the prescribed component can be supplied.

In order to make it possible for the suction nozzle 14a to pick up the components accommodated in all positions in one tray 26, it is sufficient that either the tray 26 or the suction nozzle 14a be movable in at least two perpendicular directions, X and Y. This does not pose a limitation, however, the movements may be divided between both of those parts of the apparatus, or both may move in the two directions X and Y. The component supply unit 12 can also supply the components in various package styles that accord with the type thereof, and supply mechanisms may be used which match each of those types.

The component mounting unit 13 has a carrying-in unit 27 for receiving the circuit board 1, a positioning unit 28 for positioning the received circuit board 1 in a prescribed position in preparation for component mounting, and a carrying-out unit 29 for sending the electronic circuit board, after component mounting, to the next process step. The positioning unit 28 positions the circuit board 1 in a prescribed position, in the direction of conveyance from the carrying-in unit 27 to the carrying-out unit 29, and, with movements of the suction nozzle 14a in the two directions X and Y by the moving mechanism 11, being fashioned so as to facilitate the mounting of the connector 3 in any position whatever of the circuit board 1. It is also possible, however, to make the construction such that the circuit board 1 side is moved in X and Y directions to position the suction nozzle 14a in one location, or the movements in X and Y directions may be divided between the circuit board 1 side and the suction nozzle 14a side for the positioning required for component mounting.

Figure 8:
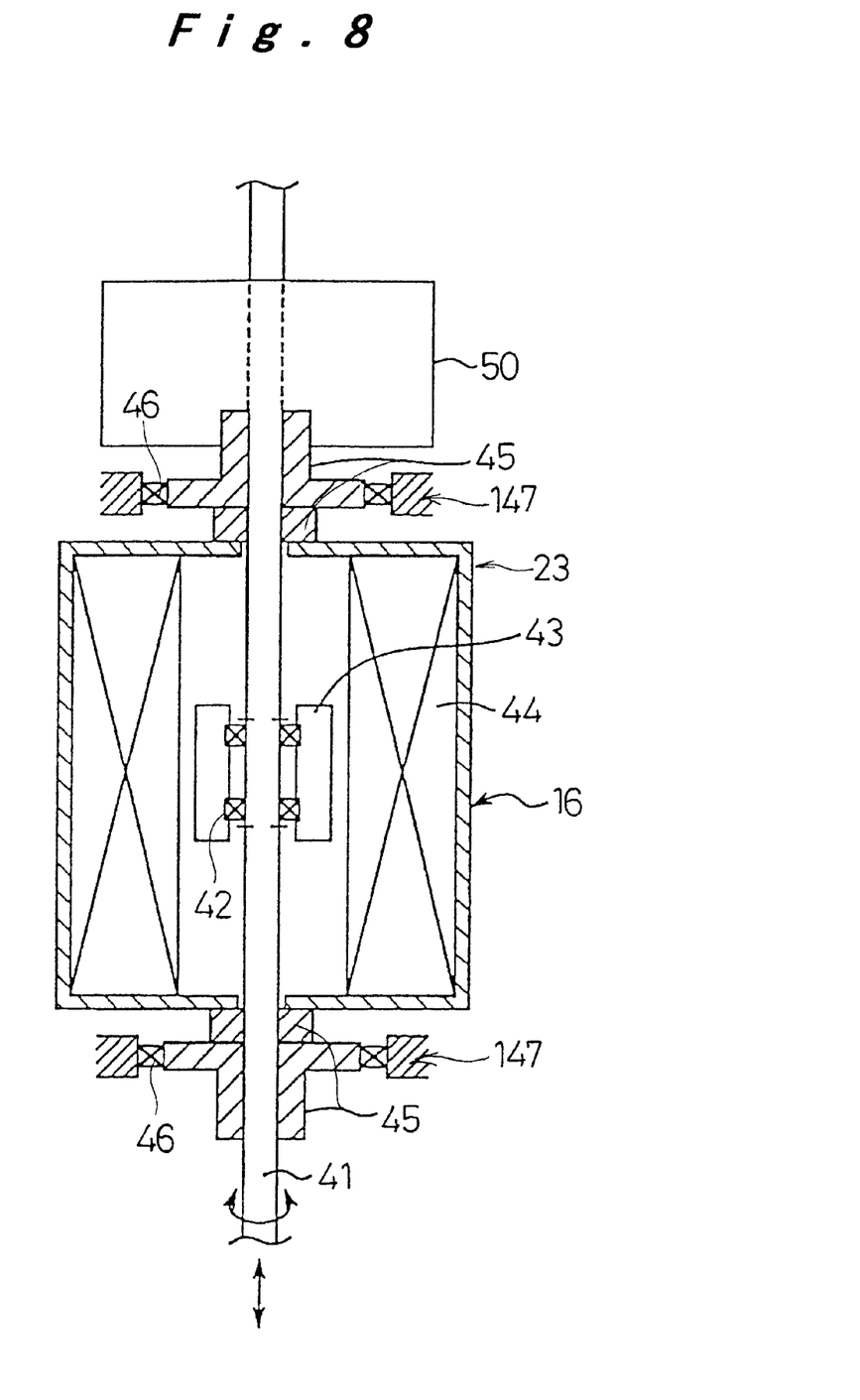
FIG. 8 is a cross-sectional view of the main parts of the component mounting head of FIG. 7.

The linear motor 16 is structured as shown in FIG. 8. A magnet 43 is attached through bearings 42 midway along a pressure shaft 41 connected and held so that component handling tools such as the suction nozzle 14a can be changed. About the magnet 43, along the axial direction of the pressure shaft 41, a coil 44 is provided, fixed to the side of the component mounting head 23. The pressure shaft 41 is held by holding units 45 provided at positions in the axial direction of the pressure shaft 41 that sandwich the coil 44 therebetween. These holding units 45 are secured to the casing 147 of the linear motor 16 through bearings 46, and support the pressure shaft 41 so that it can slide in the axial direction thereof and turn about the axis thereof. Thus, by exciting the coil 44, the pressure shaft 41 is made to move in the axial direction thereof via the magnet 43.

Because the magnet 43 is attached to the pressure shaft 41 through the bearings 42, the magnet 43 will not turn about the shaft even when the pressure shaft 41 does turn. By using the linear motor 16 in this manner, the wiring to the coil 44 can be fixed. Also, a position-speed detector 47, shown in FIG. 7, that detects the position and speed of movement of the suction nozzle 14a, is attached to the pressure shaft 41, having a rod scale 48 extending in the axial direction of the pressure shaft 41, and a ring-shaped detector head 49 provided so that the rod scale 48 passes through it.

Although not indicated in the drawing, the position-speed detector 47 is secured to a frame that supports the linear motor 16. Also, multiple magnetized portions are provided in the rod scale 48, in the circumferential direction thereof, arranged at constant intervals in the axial direction thereof. Thereby, when the rod scale 48 moves in the axial direction thereof in conjunction with movements of the pressure shaft 41 relative to the non-moving detector head 49, the magnetized portions move, and information recorded in those magnetized portions is detected by the position-speed detector 47. Thus the position of the pressure shaft 41 in the axial direction can be determined, and, from the amount of change in the magnetized portions, the speed of movement of the pressure shaft 41 can also be determined. A motor 50 is linked to the pressure shaft 41 above the holding unit 45, as shown in FIGS. 7 and 8, so that, by turning the suction nozzle 14a about the axis thereof, the attitude wherein the component that is held by the suction nozzle 14a, that is, the angle of the component about the axis of the suction nozzle, can be corrected.

Figure 1:
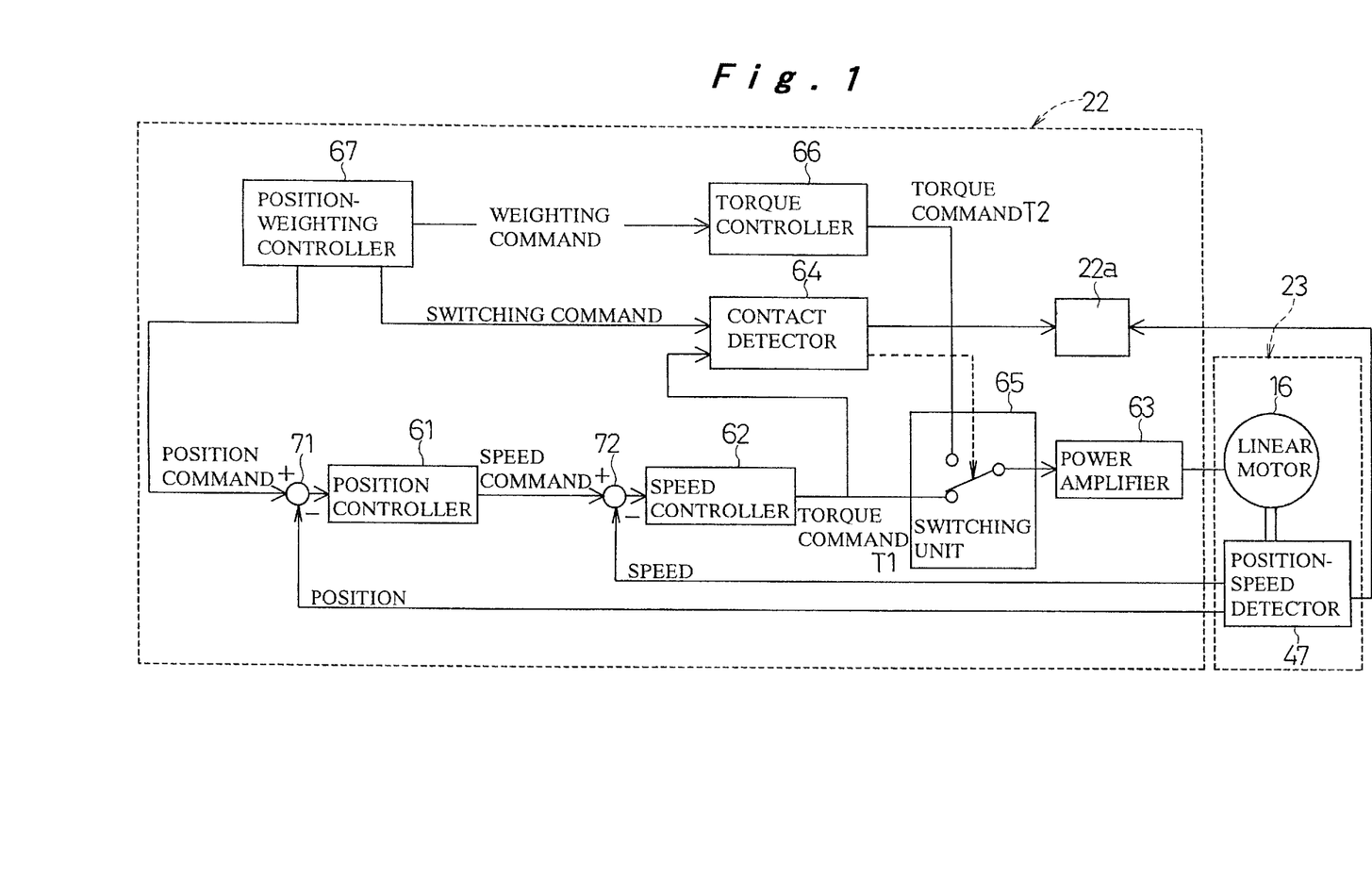
FIG. 1 is a block connection diagram for a controller used in one embodiment of the present invention.

As shown in FIG. 1, the controller 22 mainly comprises a position controller 61, a speed controller 62, a power amplifier 63, a contact detector 64, a switching unit 65, a torque controller 66, and a position-weighting controller 67. The position-speed detector 47 is connected to the input sides of the position controller 61 and speed controller 62, and to the linear motor 16 on the output side of the power amplifier 63. A first torque command T1 that is sent through the processing of the position controller 61 and the speed controller 62, and a second torque command T2 sent from the torque controller 66, are supplied to the input side of the switching unit 65. The switching unit 65, based on contact detection information from the contact detector 64, switches torque commands sent to the power amplifier 63 from the first torque command T1 to the second torque command T2. Conversely, switching from the second torque command T2 to the first torque command T1 is performed by a switching command from the position-weighting controller 67.

At the time of switching between the first torque command T1 and the second torque command T2, there is no gap between the value of the first torque command T1 and the value of the second torque command T2, whereupon no differences arise in the action control information supplied to the linear motor 16 between these two commands.

Figure 2:
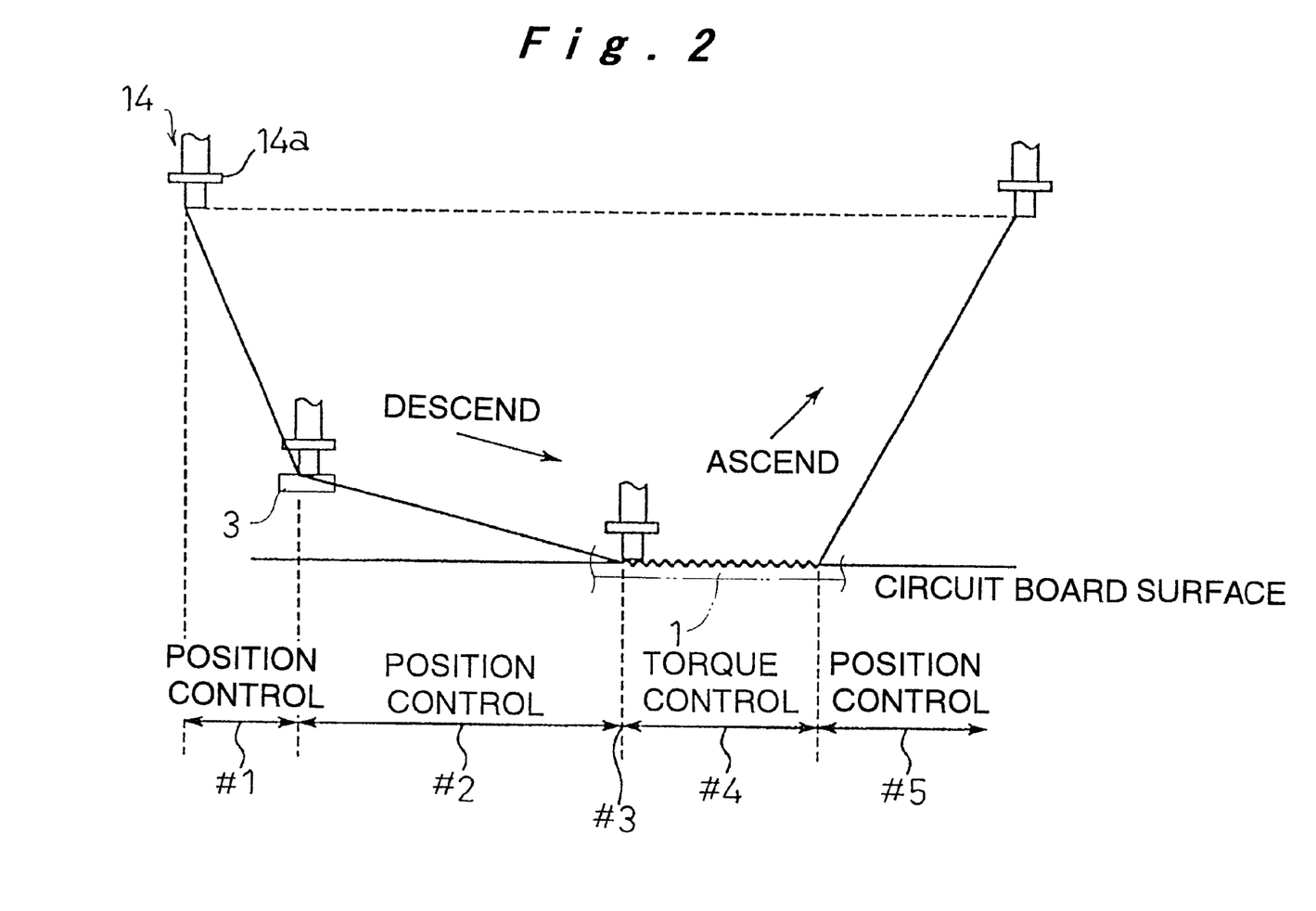
FIG. 2 is an explanatory diagram representing basic actions in component mounting operations controlled by the controller of FIG. 1.

The control is now described in more specific terms. the connector 3 is mounted to the circuit board 1. The suction nozzle 14a moves as shown in FIG. 2 from the time it picks up the connector 3 and mounts it to the circuit board 1, before it holds the next connector 3. In a first step #S1, after holding the connector 3, it descends at high speed, under positioning control, until it is immediately above the circuit board 1. In a second step #S2, the suction nozzle 14a continues descending farther, but at a constant low speed that is lower than the speed of the descent in the first step #S1.

In a third step #S3, the contact made in the second step #S2 by the connector 3 via the suction nozzle 14a with the circuit board 1 is detected. In a fourth step #S4, the connector 3 is mounted in the circuit board 1 with a predetermined amount of pressing force applied thereto. Then, in a fifth step #S5, the suction nozzle 14a ascends after releasing the suction and holding of the connector 3.

In these steps, the positions of the connector 3 in the vertical direction and the speed of movement of the suction nozzle 14a holding the connector 3 are detected by the position-speed detector 47 provided in the component mounting head 23. The position information that changes from moment to moment is supplied to a comparator 71 provided on the input side of the position controller 61, and speed information is supplied to a comparator 72 provided on the input side of the speed controller 62. Meanwhile, a position command is issued from the position-weighting controller 67. This position command is information indicating the relationship between time and the position of the suction nozzle 14a, up until the target position in the Z direction or the vertical direction, in which the connector 3 is finally placed, and as such is preset in the position-weighting controller 67 and supplied moment by moment to the comparator 71.

The comparator 71, based on the position information and the position commands occurring at the exact same time, finds the deviation therein. The deviation information so found is sent to the position controller 61. The position controller 61, based on that deviation information, determines speed commands which it sends moment by moment to the comparator 72. The comparator 72 finds the deviation between the speed information and speed command occurring at the exact same time, and sends this to the speed controller 62. The speed controller 62, based on the deviation information from the comparator 72, determines the first torque command T1. In this way, in the first step #S1, the suction nozzle 14a descends under both position control and speed control.

At the point in time where the connector 3 reaches a point immediately above the circuit board 1, the second step commences, whereupon the speed controller 62 issues a torque command to that effect to the power amplifier 63 via the switching unit 65, whereupon electric current is supplied from the power amplifier 63 to the linear motor 16. Thus the suction nozzle 14a descends farther at a constant reduced speed under position control. During this step, the torque command to the linear motor 16 is controlled at more or less a constant value because there is no change in speed.

Next, when the connector 3 comes into contact with the circuit board 1, both the deviation between the position information and the position command supplied to the position controller 61 and the deviation between the position information and the position command supplied to the speed controller 62 become large, whereupon the value of the first torque command T1 from the speed controller 62 increases. In terms of the position command information, different information is supplied respectively for each type of connector 3 or other component. The contact detector 64 detects the increase in the first torque command T1, wherefore the switching unit 65 switches the torque command to the power amplifier 63 from the first torque command T1 sent by the speed controller 62 to the second torque command T2 sent out by the torque controller 66.

After this switch is made, a second torque command T2 corresponding to a weighting command that matches the pressing force needed to mount the connector 3 to the circuit board 1 is computed by the torque controller 66 based on the thrust constant of the linear motor 16, and this second torque command T2 is supplied to the power amplifier 63 via the switching unit 65. Thus the connector 3 is mounted in the circuit board 1 in a set time period and under a set pressing force by the linear motor 16. The weighting command information, is preset for each component or for each type of component, and stored in memory, and information corresponding to the connector 3 that is being mounted is supplied from the position-weighting controller 67.

After this, the switching unit 65 is again switched to the speed controller 62 side by a switching command issued. by the position-weighting controller 67, and the suction nozzle 14a is made to ascend under control based on the first torque command T1.

As described in the foregoing, the pressure shaft 41 provided with the suction nozzle 14a is linearly driven by the linear motor 16 in the axial direction thereof, and the connector 3 is mounted on the circuit board 1 by a positioning action of the linear motor 16 and a weighting action that presses the connector 3 with a discretionary force. The mounting of the connector 3 is generally performed by the first to fourth steps #S1–#S4 described above. It is thereby possible to suppress the force of impact when the connector 3 and the circuit board 1 come into contact, and the pressing force at mounting time can be set discretionarily in response to a weighting command supplied to the torque controller 66, wherefore an improvement in mounting precision can be realized.

The contact detector 64 is provided, moreover, so that the contact between the suction nozzle 14a and the circuit board 1 is detected by a change in the torque command going to the linear motor 16 when the suction nozzle 14a or the connector 3 comes into contact with the circuit board 1.

When the component is of the type which needs inserting a part thereof into the circuit board such as the connector 3, an insertion action is involved whereby the leads 2 that are the insertion parts are inserted in the circuit board 1. In order to achieve this in a more failsafe manner, in this embodiment, a predetermined, constant pressing force is applied from the moment the leads 2 of the connector 3 first make contact with the circuit board 1 until the body 3b of the connector 3 makes contact with the circuit board 1, so that the leads 2 are thoroughly inserted into the insertion holes 4 in the circuit board 1. In order to do this satisfactorily, contact detection is not performed at the position where the leads 2 make contact with the circuit board 1, but rather contact detection is performed with a target position that is the position where the body 3b of the connector 3 makes contact with the circuit board 1 where the leads 2 are completely inserted in the insertion holes 4. When this is detected, the pressing action is switched to. That is, the pressing action is switched to after the connector 3 is in a completely inserted condition.

Figure 3:
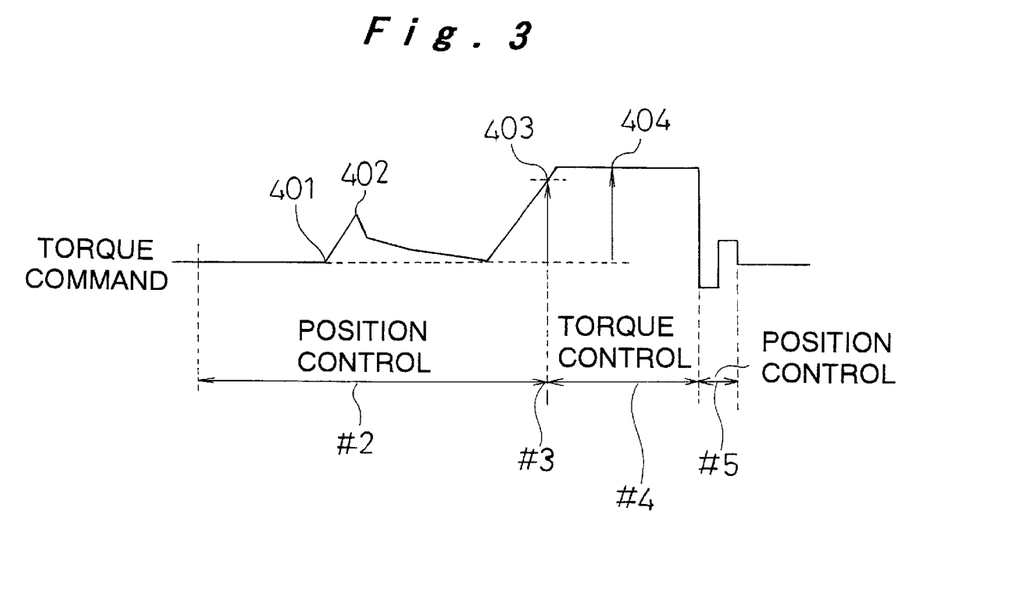
FIG. 3 is an explanatory diagram representing one embodiment of a component mounting method using the controller of FIG. 1.
Figure 5A:
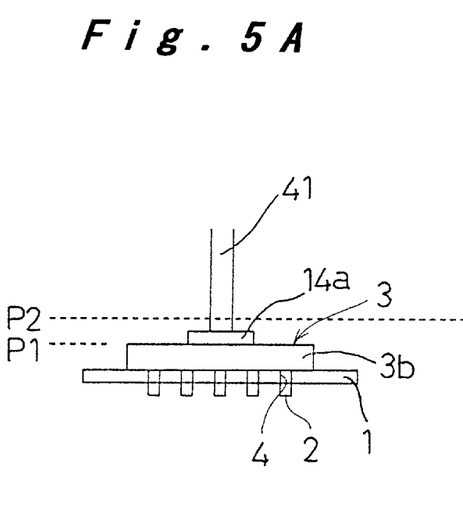
FIGS. 5A and 5B represent component mounting conditions with the embodiment represented in FIG. 4, diagramming in FIG. 5A a condition wherein mounting was proper, and in FIG. 5B a condition wherein mounting was improper.

The value of the torque command varies at this time as shown in FIG. 3. At 401, where the leads 2 of the connector 3 contact the circuit board 1 in a certain speed condition in the second step #S2 described earlier, contact is not detected, and the descent is continued further at that certain speed. At this time, a pressing force 402 for inserting the leads 2 of the connector 3 into the insertion holes 4 of the circuit board 1 is generated for the linear motor 16. Thereafter, when the leads 2 are completely inserted until the body 3b of the connector 3 makes contact with the circuit board 1 as shown in FIG. 5A, the torque command continues to increase, becoming a contact detection weighting value 403 that is a certain set value which is larger than the pressing force when inserting the leads 2 of the connector 3 into the circuit board 1. The contact detection in the third step #S3 is made based on this weighting value 403, and the downward movement of the suction nozzle is switched to the pressing action in the fourth step #S4, so that the connector 3 is mounted in the circuit board 1 with the set pressing force 404. Finally, after releasing the holding of the connector 3, the suction nozzle 14a ascends.

Figure 4:
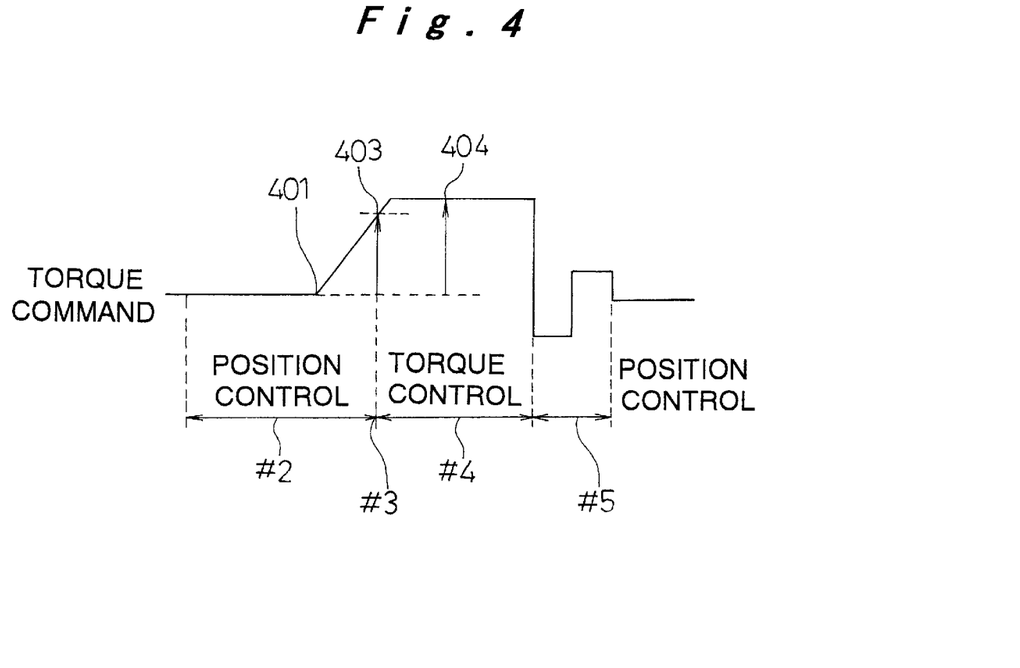
FIG. 4 is an explanatory diagram representing another embodiment of a component mounting method using the controller of FIG. 1.
Figure 5B:
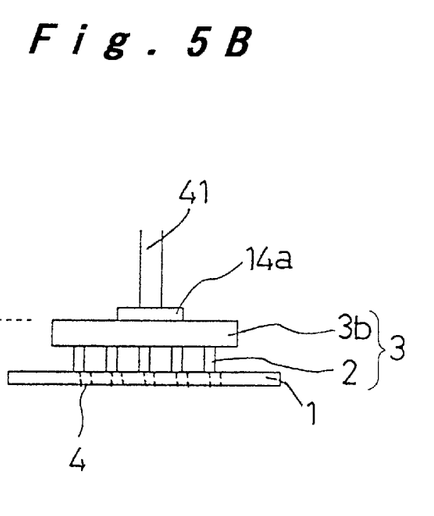

When under some influence or other the positions of the connector 3 and circuit board 1 are skewed as shown in FIG. 5B, the value of the torque command varies as shown in FIG. 4. In this case, due to the positioning fault, the torque command continues increasing at the same time that the leads 2 of the connector 3 and the circuit board 1 make contact, and will quickly increase to the contact detection weighting value 403 that is some certain set value. The contact detection of the third step #S3 is performed at this point of time, and the downward movement of the suction nozzle is switched to the pressing action in the fourth step #S4. The pressing force 402, which is a preset value, as shown in FIG. 3, is not generated. The leads 2 of the connector 3 are not in the prescribed position on the circuit board 1, but since only a pressing force corresponding to the set weighting is applied, the connector 3 and circuit board 1 will not be damaged.

Another embodiment is now described with reference to FIGS. 5A and 5B. FIG. 5A represents the case where the connector 3 is properly inserted, while FIG. 5B represents an example where proper insertion is not effected because the leads 2 of the connector 3 and the insertion holes 4 of the circuit board 1 are out of position. As shown in FIG. 5A, because the connector is inserted in the proper position, the position of the lower end surface of the suction nozzle 14a when the linear motor 16 is performing the pressing action of the third step #S3 comes to a height P1. In the case shown in FIG. 5B, however, wherein a positional shift has occurred between the leads 2 of the connector 3 and the insertion holes 4 of the circuit board 1, the leads 2 of the connector 3 are not inserted in the insertion holes 4 of the circuit board 1, wherefore the position of the lower end surface of the suction nozzle 14a when the linear motor 16 is performing the pressing action in the fourth step #S4 comes to a height P2, which is higher than normal by the length of the leads 2 of the connector. This height is detected to determine whether or not the connector has been inserted properly. This determination can be made automatically by determination means 22a that is an internal function of the controller 22. The specific configuration of the controller 22 and the determination means 22a can be variously altered, however.

In a case where insertion is not effected as shown in FIG. 5B, the connector 3 is taken back from the component mounting unit 13 while still suction-held to the suction nozzle 14a in the fifth step #S5, whereupon the positions of the connector 3 and circuit board 1 can again be verified. The first to fifth steps #S1–#S5 are then repeated, so that the connector 3 is mounted properly. Thus it is possible to avoid both damage to the connector 3, circuit board 1, or suction nozzle 14a by forcing an insertion operation with improper insertion, and having to discard faulty components. Thus effective utilization is facilitated with good work efficiency and without the time and trouble of re-holding. Such handling also can be automatically achieved by the operation of the controller 22 noted earlier.

INDUSTRIAL APPLICABILITY

As described above, the present invention provides an improved method and apparatus for mounting components on a circuit board using a suction nozzle that is moved linearly up and down by feedback control of a linear motor. Control is made such that the downward movement operation of the suction nozzle effected by the linear motor is switched to a pressing operation thereof upon detecting contact between the suction nozzle and the component or between the component held by the suction nozzle and the circuit board, whereby the component is picked up or mounted in a predetermined favorable pressed condition. Damages to the component and the circuit board can be thereby prevented. Accordingly, the present invention can be advantageously applied broadly to the field of component pick-and-place assembly systems.

What is claimed is:

1. A method for mounting a component onto a mounting object, supplied by a supply unit located at a supply position, the mounting object positioned at a mounting unit located at a mounting position, using a component handling tool, which is supported by a moving mechanism configured to move between the supply position and the mounting position, the method comprising:

moving the component handling tool up and down, using a linear motor connected to the moving mechanism, to initiate one of component pick-up at the supply position and component mounting at the mounting position;

detecting one of an initial contact between the component handling tool and the component at the supply position and between the component and the mounting object at the mounting position;

generating control information indicating the detected initial contact; and switching the linear motor to a pressing operation, enabling the component handling tool to pick-up the component at the supply position and to mount the component at the component mounting position, in response to
the control information.

2. The method for mounting a component according to claim 1, wherein mounting the component comprises inserting a portion of the component into the mounting object.

3. A method for mounting a component, having at least one insertion portion, onto a mounting object positioned on a component mounting unit, using a component handling tool that is moved linearly upward and downward by a linear motor, the method comprising:

moving the component handling tool downward to the mounting object, causing the at least one insertion portion of the component to be inserted into a corresponding hole of the mounting object;

switching the linear motor to a pressing operation when feedback control information indicates an initial contact between the component and the mounting object; and mounting the component onto the mounting object in a pressed condition by the pressing operation.

4. The method for mounting a component according to claim 3, the component comprising a connector and the at least one insertion portion comprising a plurality of leads.

5. The method for mounting a component according to claim 4, further comprising:

determining whether the at least one insertion portion of the component is properly inserted into the corresponding hole of the mounting object, when the component makes contact with the mounting object, based on a position of the linear motor.

6. The method for mounting a component according to claim 5, further comprising:

repeating at least the switching to the pressing operation of the component when the at least one insertion portion is determined not to be properly inserted into the corresponding hole of the mounting object.

7. A component mounting apparatus, for mounting a component onto a mounting object, comprising:

a component handling tool that engages the component;

a moving mechanism, configured to move the component handling tool between a supply unit, which supplies the component, and a mounting unit, which holds the mounting object;

a linear motor, connected to the moving mechanism and configured to linearly move the component handling tool upward and downward above each of the supply unit and the mounting unit, enabling the component to be picked up and mounted, respectively; and a controller that controls the linear motor to move the component handling tool downward, for one of picking up the component at the supply unit and mounting the component at the mounting unit, and that detects one of contact between the component handling tool and the component at the supply unit and contact between the component and the mounting object at the mounting unit, based on feedback control information;

the controller switching the linear motor to a pressing operation, based on the detected contact, to perform one of picking up the component at the supply unit and mounting the component in a predetermined pressed condition at the mounting unit.

8. A component mounting apparatus, for mounting a component, having at least one insertion portion, onto a mounting object, the apparatus comprising:

a component handling tool that engages the component;

a moving mechanism, configured to move the component handling tool between a supply unit, which supplies the component, and a mounting unit, which holds the mounting object;

a linear motor, connected to the moving mechanism and configured to linearly move the component handling tool upward and downward with respect to at least the mounting unit; and a controller that controls the linear motor to move the component handling tool downward to the mounting unit, until the at least one insertion portion of the component is inserted into a corresponding hole of the mounting object, and that detects contact between the component and the mounting object based on feedback control information, indicating at least a position of the linear motor;

the controller switching the linear motor to a pressing operation, based on the detected contact, to enable the component to be mounted on the mounting object in a predetermined pressed condition.

9. The component mounting apparatus according to claim 8, the component comprising a connector and the at least one insertion portion comprising a plurality of leads.

10. The component mounting apparatus according to claim 9, the controller further determining whether or not the at least one insertion portion of the component has been properly inserted into the corresponding hole in the mounting object, based on the feedback control information.

11. The component mounting apparatus according to claim 10, the controller further repeating at least the switching to the pressing operation of the component when the at least one insertion portion is determined not to be properly inserted into the corresponding hole of the mounting object.

* * * * *

UNITED STATES PATENT AND TRADEMARK OFFICE
CERTIFICATE OF CORRECTION

PATENT NO.      : 6,513,233 B1
DATED           : February 4, 2003
INVENTOR(S)     : O. Nakao et al.

It is certified that error appears in the above-identified patent and that said Letters Patent is hereby corrected as shown below:

<u>Title page,</u>
Item [54], Title, "COMPONENT MOUNTING METHOD AND APPARATUS" should be -- A COMPONENT MOUNTING METHOD AND APPARATUS INVOLVING A LINEAR MOTOR --.

Signed and Sealed this

Fourteenth Day of October, 2003

JAMES E. ROGAN
*Director of the United States Patent and Trademark Office*